United States Patent [19]

Fellinger et al.

[11] Patent Number: 4,801,824
[45] Date of Patent: Jan. 31, 1989

[54] INTEGRABLE BUFFER CIRCUIT FOR VOLTAGE LEVEL CONVERSION HAVING CLAMPING MEANS

[75] Inventors: Christine Fellinger, Unterhaching; Josef Einzinger, Unterschleissheim; Ludwid Leipold, Munich; Jenoe Tihanyi, Munich; Roland Weber, Munich, all of Fed. Rep. of Germany

[73] Assignee: Siemens Aktiengesellschaft, Berlin and Munich, Fed. Rep. of Germany

[21] Appl. No.: 76,255

[22] Filed: Jul. 21, 1987

[30] Foreign Application Priority Data

Jul. 21, 1986 [DE] Fed. Rep. of Germany ....... 3624565

[51] Int. Cl.⁴ .................. H03K 17/10; H03K 17/16; H03K 17/687; H03K 5/04
[52] U.S. Cl. .................................. 307/558; 307/561; 307/548; 307/560; 307/475
[58] Field of Search ............... 307/475, 552, 544, 546, 307/547–551, 557–561, 565, 568, 567, 450, 451, 585, 576, 579, 443, 279, 290, 603

[56] References Cited

U.S. PATENT DOCUMENTS

| | | | |
|---|---|---|---|
| 3,731,206 | 5/1973 | Veale | 307/561 X |
| 3,746,893 | 7/1973 | De Bretagne | 307/552 X |
| 3,947,727 | 3/1976 | Stewart | 307/568 X |
| 4,697,110 | 9/1987 | Masuda et al. | 307/475 |
| 4,723,082 | 2/1988 | Asano et al. | 307/443 X |
| 4,728,821 | 3/1988 | Yang et al. | 307/559 X |

*Primary Examiner*—John S. Heyman
*Assistant Examiner*—David R. Bertelson
*Attorney, Agent, or Firm*—John Francis Moran

[57] ABSTRACT

A signal voltage (E) based upon a supply voltage must be converted to a signal voltage (A) with ground reference so as to enable further processing in a logic circuit. A simple level converter comprises a series connection of a MOSFET (T1) connected to the supply voltage; the MOSFET also comprises a resistor (T2). The source terminal of the MOSFET (T1) is located at the potential of the supply voltage. The voltage to be converted is applied between the gate terminal and the source terminal, and the converted voltage occurs at the resistor (T2). The two voltages are each limited by one Zener diode (D2, D1).

4 Claims, 1 Drawing Sheet

INTEGRABLE BUFFER CIRCUIT FOR VOLTAGE LEVEL CONVERSION HAVING CLAMPING MEANS

BACKGROUND OF THE INVENTION

This invention relates to level translation circuitry, and it relates, more particularly to circuitry for converting a first signal voltage, which is connected to a supply voltage, into a second signal voltage with ground reference.

Circuit configuration of this type are typically required when a voltage lower than the supply voltage is to be converted into a logic-compatible voltage. Since electronic logic circuits are electrically referenced to ground as a rule, the first signal voltage must be converted into a second signal with a ground potential voltage reference. The second signal voltage must then be of a suitable amplitude compatible with operating electronic logic circuitry.

SUMMARY OF THE INVENTION

It is an object of the invention to provide a simple and integrable circuit arrangement which serves as a level shifter or translator.

The present invention takes the form of arrangement wherein a series connection including a MOSFET and at least one resistor is located between the first and the second terminal; the source terminal of the MOSFET is connected to the first terminal; the gate terminal of the MOSFET is connected to the third terminal; a first Zener diode which limits the first signal voltage is connected across the first and the third terminal; a fourth terminal is connected to the terminal of the resistor which is not connected with the second terminal; and a second Zener diode which limits the second signal voltage is connected across the second and the fourth terminal.

In some of the further aspects of the invention, one or more diodes are serially connected between the first terminal and the source terminal of the MOSFET. A second resistor is included in the series connection between the MOSFET and the one resistor. The input terminal, of the third terminal, is connected to the emitter terminal of a transsistor which thermally tracks the temperature of a power semiconductor component to provide a thermal shut off of the power semiconductor component. The one resistor and the second resistor may take the form of depletion MOSFET's wherein the gate terminal and the source terminal are connected together.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 1:
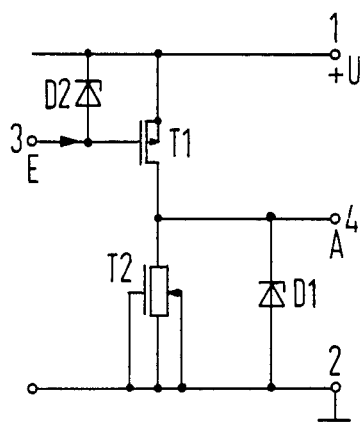
FIG. 1 is a first illustrative embodiment of the present invention.

In FIG. 1, a circuit diagram is provided which includes a series connection of a first MOSFET T1 and a second MOSFET T2. This seris connection is connected via the terminals 1 and 2 to voltage supply potential +U. Terminal 2 is maintained at ground potential. The gate terminal of the MOSFET T1 is connected to a third terminal 3. The drain terminal of T1, that of T2 or the terminal of T2, which is opposite to that of terminal connected to the terminal 2, is connected to a fourth terminal 4. A first signal voltage E is applied between the first terminal 1 and the third terminal 3. Between the terminals 1 and 3, there is located a Zener diode D2 limiting the first signal voltage. The second signal voltage A is between the terminals 2 and 4. This voltage is limited by the Zener diode D1.

The MOSFET T1 is an enhancement FET, which is a p-type channel, as is indicated by the polarity of the supply voltage. The MOSFET T2 is a depletion FET, in this instance an n-type channel. If the circuit configuration is instead connected to a negative supply voltage $-U$, complementary channel types must be used in this case. The MOSFET T2 may also be replaced by an ohmin resistor.

When the value of the first signal voltage is lower than the threshold voltage of T1, which is applied across the terminals 1 and 3, then T1 remains off or blocked. The gate terminal of T2 is connected with its source terminal. It thus acts as a current source and, while the transistor T1 is blocked, it has a very low internal resistance. Therefore, terminal 4 is at ground reference which is detected, for example, as a signal L, between the terminals 2 and 4 of the logic circuit to be connected. When a voltage exceeding the threshold voltage of MOSFET T1 is applied to the terminals 1 and 3, then T1 is activated, or turned on, and a potential varying between the potential +U and ground will occur at the terminal 4, with a value determined by the Zener voltage of the Zener diode D1. If the effect of D1 is not taken into account, this potential will be closer to the potential +U, the greater the ratio of the currents which run through T1 and T2. For practical purposes, MOSFET 1 and 2 are designed with different transconductances so that the flow of current through T1, when operating is several times that which rungs through T2.

Figure 2:
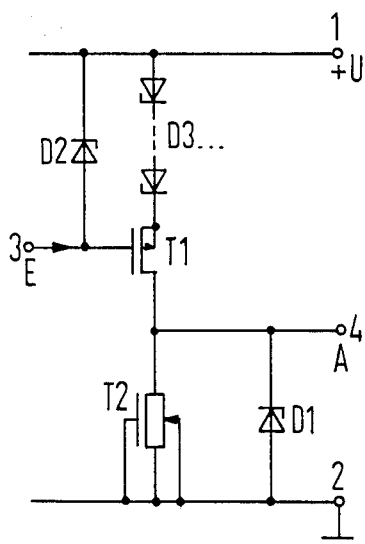
FIG. 2 depicts a second illustrative embodiment of the invention.

The circuit configuration of FIG. 2 differs from that of FIG. 1 in that one or several diodes D3 are connected in between the source terminal T1 and the first terminal 1. These diodes can, for example, be Zener diodes. Consequently, the first signal voltage applied to the terminals 1, 3 can be higher than the threshold voltage T1, before these diodes start conducting current. T1 is operating only when the first signal voltage exceeds the threshold voltage of the MOSFET T, and the sum of the threshold voltages of D3.

Figure 3:
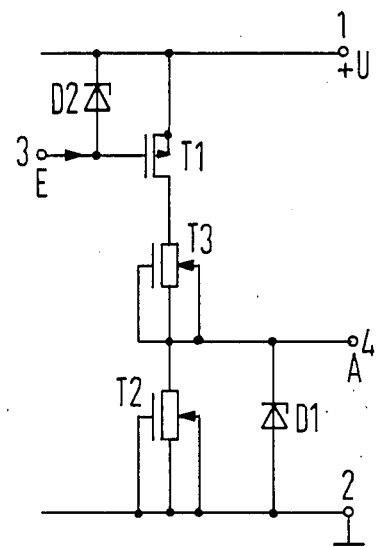
FIG. 3 is a circuit diagram of a third illustrative embodiment of the invention.

In contrast to FIG. 1, the circuit configuration according to FIG. 3 is provided with an additional depletion FET T3 which is connected between the drain terminal of T1 and the terminal 4 or the drain terminal of T2 or the side of a corresonding resistor turned away from the terminal 2. When MOSFET T1 is conducting FET T3 limits the flow of cross current through the series circuit. If a first signal voltage, which opens T1, is then applied between the terminals 1 and 3, a smaller amount of current, as compared with the circuit configuration shown in FIG. 1, flows through the series circuit.

Figure 4:
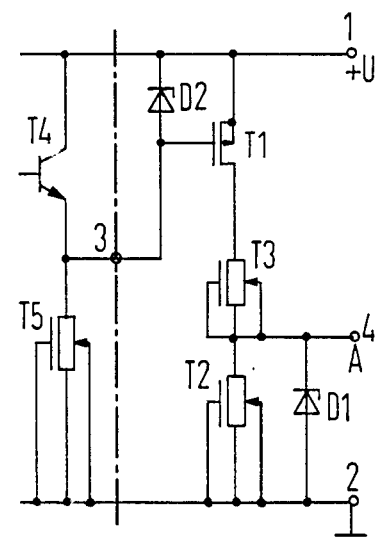
FIG. 4 provides a typical application for the circuit of FIG. 3 for measuring temperatures utilizing a bipolar transistor.

In FIG. 4, the first signal voltage can be generated by a bipolar transistor T4 which is series-connected with a further depletion MOSFET T5 between the terminals 1 and 2. Transistor T4 may, for example, be in thermal contact with a power semiconductor component, e.g., a power MOSFET. When this power component heats up, the flow of current through T4 increases. If the current flowing through T4 exceeds the current through the FET T5, which is used as a current source, the internal resistance of T5 increases considerably, and the voltage at the terminal 3 increases rapidly starting at ground potential. If during this process the starting voltage of T1 goes down, T1 will stop conducting, and the potential at the terminal 4 falls back to ground.

On the other hand, this output potential can be detected as a signal L by logic circuitry (not shown) connected to the terminal 4, and it can be used to provide a disconnection of the power semiconductor component. Therefore, such an arrangement may be used as a safety device.

There has thus been shown and described a novel level shifter which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

We claim:

1. A circuit arrangement for converting a first signal voltage, referenced to a voltage supply potential, into a second signal voltage referenced to ground potential, the arrangement comprising:
   (a) a MOSFET and at least one resistor serially connected between a first and a second terminal;
   (b) the MOSFET having a source terminal connected to the first terminal;
   (c) at least one diode is connected in the forward direction of the flow of current between the first terminal and the source terminal of the MOSFET;
   (d) the MOSFET having a gate terminal connected to a third terminal;
   (e) a first Zener diode is connected between the first terminal and the third terminals for limiting the first signal voltage;
   (f) a fourth terminal is connected to one terminal of the resistor while the other terminal of the resistor is connected to the second terminal; and
   (g) a second Zener diode is connected between the second terminal and the fourth terminal for limiting the second signal voltage.

2. A circuit arrangement according to claim 1, comprising a further resistor connected between a drain terminal of the MOSFET and the one terminal of the resistor while the other terminal is connected to the second terminal.

3. A circuit arrangement as defined in claim 1, wherein the resistors each comprise a depletion MOSFET wherein its source terminal and its gate terminal are interconnected.

4. A circuit arrangement as defined in claim 3, wherein the resistors each comprise a depletion MOSFET wherein its source terminal and its gate terminal are interconnected.

* * * * *